United States Patent [19]

Fickes et al.

[11] 4,451,553

[45] May 29, 1984

[54] HALOGEN FINISHING OF FLEXOGRAPHIC PRINTING PLATES CONTAINING BUTADIENE/ACRYLONITRILE COPOLYMERS

[75] Inventors: Michael G. Fickes, Colts Neck; Bohdan Rakoczy, East Brunswick, both of N.J.

[73] Assignee: E. I. Du Pont de Nemours and Company, Wilmington, Del.

[21] Appl. No.: 472,103

[22] Filed: Mar. 4, 1983

Related U.S. Application Data

[63] Continuation-in-part of Ser. No. 386,910, Jun. 10, 1982, abandoned.

[51] Int. Cl.$^3$ ............................................. G03C 5/00
[52] U.S. Cl. .................................. 430/306; 430/281; 430/286; 430/302; 430/325; 430/328
[58] Field of Search ............... 430/306, 309, 325, 328, 430/302, 281, 286

[56] References Cited

U.S. PATENT DOCUMENTS 3,968,316 7/1976 Jyo et al. ............................ 428/492
4,177,074 12/1979 Proskow ............................. 430/286

FOREIGN PATENT DOCUMENTS 21829 1/1981 European Pat. Off. .
2823300 12/1979 Fed. Rep. of Germany .

*Primary Examiner*—Jack P. Brammer

[57] ABSTRACT

Process for providing improved solvent resistant surfaces of relief flexographic printing plates prepared by imagewise exposure and liquid development of the unexposed areas of a layer of photosensitive elastomeric composition comprising a high molecular weight butadiene/acrylonitrile copolymer and a monomeric compound wherein, optionally after drying, the developed surface is, in either order, (1) postexposed to actinic radiation, and (2) contacted with two successive aqueous halogen solutions, first, 0.01 to 3.5% by weight aqueous bromine solution for about 15 seconds to 20 minutes or 0.2 to 10% by weight aqueous iodine solution for about 1.0 to 10 minutes, followed by chlorine solution equivalent to that supplied by an aqueous solution, 0.01 to 1.0 molar in NaOCl and 0.012 to 1.2 molar in HCl, for about 15 seconds to 5 minutes.

9 Claims, No Drawings

HALOGEN FINISHING OF FLEXOGRAPHIC PRINTING PLATES CONTAINING BUTADIENE/ACRYLONITRILE COPOLYMERS

DESCRIPTION

Cross Reference to Related Applications

This application is a continuation-in-part of application Ser. No. 386,910, filed June 10, 1982, now abandoned.

TECHNICAL FIELD

This invention relates to the surface treatment by halogen of flexographic printing plates having a photosensitive layer containing a butadiene/acrylonitrile copolymer. More particularly this invention relates to surface treatment of a photosensitive layer containing butadiene/acrylonitrile copolymer with bromine or iodine followed by chlorine and the product produced thereby.

BACKGROUND ART

Photosensitive flexographic printing plates have achieved considerable importance in the printing trade. Particularly useful compositions for preparing such flexographic printing plates include: compositions containing addition-polymerizable, ethylenically unsaturated compounds, photoinitiators and as polymeric binders either block copolymers such as styrene-butadiene-styrene and styrene-isoprene-styrene polymers, or butadiene/acrylonitrile polymers with optional carboxyl groups. The printing plates utilizing compositions containing said block copolymers are generally compatible only with alcohol or alcohol-acetate based inks; while printing plates utilizing compositions containing butadiene/acrylonitrile polymers with optional carboxyl groups are generally only compatible with hydrocarbon based inks.

The flexographic printing plates containing styrene-butadiene-styrene or styrene-isoprene-styrene block copolymer binders, after imagewise exposure, e.g., through a process transparency, and development, are generally treated with an acid hypochlorite solution to reduce the tackiness of the layer. A reduction in tackiness can also be achieved by use of a bromine solution; however, neither chlorine nor bromine treatment renders printing plates based on these block copolymers compatible with hydrocarbon based inks.

Flexographic printing plates containing a butadiene/acrylonitrile polymer with optional carboxyl groups, however, are not only tacky but are susceptible to attack by certain solvents and other components present in some printing inks, e.g., alcohols, acetates, etc. Use of these plates is limited therefore to a restricted class of inks containing substantial amounts of hydrocarbon solvents. The use of a chlorine-containing solution such as a hypochlorite solution may alleviate the tackiness but does not prevent the printing surface of the printing plate from being attacked by inks containing alcohols and various other solvents. The butadiene/acrylonitrile polymer-containing flexographic printing plates, when treated with an aqueous solution having a free bromine concentration, either before or after postexposure (an overall nonimagewise exposure which occurs subsequent to the imagewise exposure), exhibit an increase in solvent resistance to all inks, and most notably in resistance to alcohol containing inks and various other nonhydrocarbon solvents. The improvement, however, is insufficient to be of practical use when the alcohol-containing inks also contain high levels of acetate esters or other aggressive co-solvents. Chlorine treatment, introduced to reduce tack, does not increase resistance and may lower it. The improvement is also not observed with either chlorine or bromine treatment of styrene-isoprene-styrene or styrene-butadiene-styrene block copolymer-containing printing plates.

Styrene-isoprene-styrene, styrene-butadiene-styrene block copolymer-containing flexographic printing plates and butadiene/acrylonitrile copolymer including optional carboxyl group-containing flexographic printing plates are detackified and provided with increased resistance to "post-hardening due to light" by treatment with iodine. It is not known whether or not iodine treatment improves solvent resistance.

There is a need for an improved, two-halogen, treatment process for printing plates prepared from photosensitive compositions containing butadiene/acrylonitrile copolymers with optional carboxyl groups, said process rendering the plates compatible with the spectrum of inks, ink solvents, and co-solvents currently available to the skilled artisan, such as, alcohol, alcohol-acetate, hydrocarbon, alcohol-hydrocarbon, alcohol-water, etc.

There is also a need for a process wherein the two halogen treatments are applied in the order: bromine and chlorine or iodine and chlorine and treatment can occur prior to or subsequent to postexposure.

There is a further need for a process for immediate two-halogen treatment without the necessity of drying of said printing plates which have been aqueous developed.

DISCLOSURE OF THE INVENTION

In accordance with this invention there is provided a process for providing an improved solvent resistant surface to a relief photosensitive flexographic printing plate wherein the areas in relief are prepared by imagewise exposure with actinic radiation and liquid development of unexposed areas of a layer of a photosensitive, elastomeric composition comprising a high molecular weight butadiene/acrylonitrile copolymer having a number average molecular weight of 20,000 to 75,000, an acrylonitrile content of 10 to 50% by weight and a carboxyl content of 0 to 15% by weight and a nongaseous ethylenically unsaturated compound containing at least one terminal ethylenic group, the process comprising, after optionally drying the areas in relief, in either order, (1) postexposing the developed surface to a source of actinic radiation, and (2) contacting the developed surface in succession with two aqueous halogen solutions, the first halogen solution being either an aqueous solution having a free bromine concentration of 0.01 to 3.5% by weight, with contact for about 15 seconds to 20 minutes, or an aqueous solution having a free iodine concentration of 0.2 to 10% by weight, with contact for about 1.0 to 10 minutes, followed by the second halogen solution of chlorine equivalent to that supplied by an aqueous solution, 0.01 to 1.0 molar in NaOCl and 0.012 to 1.2 molar in HCl, with contact for about 15 seconds to 5 minutes.

The photosensitive compositions used in the process of this invention comprise a high molecular weight butadiene/acrylonitrile copolymer, a nongaseous, ethylenically unsaturated compund, an organic, radiation-sensitive, free-radical generating photoinitiator or photoinitiator system as well as other additives discussed below. The compositions may be used in layer form or a layer of the composition may be adhered to flexible supports or a temporary support may be used. Useful flexible supports include: plastic films and metal sheets, open or closed cell foams, flexible rubber layers, or a combination of foams and rubber layers with plastic films. When the combination support is used the plastic film is generally adjacent to the photosensitive layer. Examples of such supports include: polymeric films such as polyethylene terephthalate, flame-treated polyethylene terephthalate, electron-discharge treated polyethylene terephthalate, polyimide, e.g., film as disclosed in U.S. Pat. No. 3,179,634 which is incorporated by reference, etc., and thin metal sheets such as aluminum, tin-plated steel (dull or shiny). The polymeric supports generally have a thickness in the range of 0.001 inch to 0.007 inch (0.025 to 0.18 mm). The metal supports generally have a thickness in the range of 0.010 to 0.0115 inch (0.25 to 0.29 mm) for aluminum and 0.008 to 0.010 inch (0.20 to 0.25 mm) for tin plated steel. Examples of foam supports include open or closed cell foams, e.g., polyvinyl chloride, polyurethane, ethylenepolylenediene rubber, neoprene, etc. Examples of compressible rubbers include: styrene/isoprene block copolymers, butadiene/acrylonitrile copolymers, natural rubber, etc.

The photosensitive compositions disclosed herein are developable in their unexposed state in aqueous, semiaqueous basic, or solvent solutions depending on the carboxyl content of the polymeric binder component of the photosensitive composition. The photosensitive layers are in the thickness range of 0.005 to 0.250 inch (about 0.13 to 6.35 mm) or more.

One essential ingredient of the photosensitive, elastomeric composition is a high molecular weight butadiene/acrylonitrile copolymer (a) having a number average molecular weight ($\overline{M}n$) in the range of about 20,000 to about 75,000, preferably in the range of about 25,000 to about 50,000. The $\overline{M}n$ for the polymers described herein can be determined by gel permeation chromatography employing a polybutadiene standard. The acrylonitrile content of the polymers varies from about 10 to about 50% by weight, preferably from about 15 to about 40%. Optionally, the copolymer also has a carboxyl content of 0 to about 15% by weight. When the copolymer contains carboxyl groups, the carboxyl content is preferably in the range of about 1 to about 15%, most preferably in the range of about 2 to about 10% by weight. The copolymer is present in an amount of about 55 to 90% by weight, based on the total weight of the composition, and preferably about 60 to about 75% by weight. At least about 55% by weight of the copolymer is necessary to give adequate flexibility and physical integrity to the photosensitive elements, particularly for flexographic plates.

Carboxyl groups may be incorporated into the high molecular weight copolymer by addition to the polymerization process of a carboxyl containing monomer, e.g., acrylic or methacrylic acid, or a monomer which is convertible to a carboxyl containing group, e.g., maleic anhydride or methyl methacrylate. Such polymers are available commercially for several sources, e.g., from the B. F. Goodrich Chemical Company under the trade name Hycar ®.

Another essential ingredient of the photosensitive compositions of this invention is a nongaseous, ethylenically unsaturated compound containing at least one terminal ethylenic group (b). This compound should be capable of forming a high molecular weight polymer by free-radical initiated chain-propagating addition polymerization and be compatible with the high molecular weight polymers (a) described above. One class of suitable ethylenically unsaturated compounds includes unsaturated esters of alcohols, especially such esters of α-methylene carboxylic acids and substituted α-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2–15 carbon atoms or polyalkylene ether polyols or glycols of 1 to 10 ether linkages.

The following specific compounds are further illustrative of this class: t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also, useful are diacrylate and dimethacrylate esters of diepoxy polyethers derived from aromatic polyhydroxy compounds such as bisphenols, novolaks and similar compounds such as those described by Crary in U.S. Pat. No. 3,661,576, which is incorporated by reference, the bis-acrylates and methacrylates of polyethylene glycols of molecular weight 200 to 500, etc.

Another class of suitable ethylenically unsaturated compounds includes the compounds disclosed by Martin and Barney in U.S. Pat. No. 2,927,022 which is incorporated by reference, e.g., those having a plurality of addition polymerizable ethylenic linkages, particularly when present as terminal linkages, and especially those wherein at least one and preferably most of such linkages are conjugated with a double bonded carbon, including carbon double bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of α-methylene carboxylic acids, especially with α-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(methacrylamidopropoxy)ethane, β-methacrylamidoethyl methacrylate, N-(β-hydroxyethyl)-β-(methacrylamido)ethyl acrylate, and N,N-bis(β-methacryloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; diallyl fumarate; etc.

Additional ethylenically unsaturated compounds which may be used include styrene and derivatives thereof: 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described in Crary U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable when aqueous basic-developable systems are involved. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of adducts of ethylene oxide and polyhydroxy compounds such as those described by Cohen and Schoenthaler in U.S. Pat. No. 3,380,831 are also useful. The photocrosslinkable polymers disclosed in Schoenthaler, U.S. Pat. No. 3,418,295, and Celeste, U.S. Pat. No. 3,448,089, may also be used. All of these patents are incorporated by reference.

The amount of unsaturated compound added should be in the range of about 2 to about 40% by weight, based on the total weight of composition. The specific amount for optimum results will vary depending on the particular polymers used. Preferably the amount of unsaturated compound is in the range of about 5 to about 25% by weight.

The ethylenically unsaturated compound preferably has a boiling point at normal pressure of over about 100° C. The most preferred ethylenically unsaturated compounds are triethylene glycol diacrylate, triethylene glycol dimethacrylate, hexamethylene glycol dimethacrylate and hexamethylene glycol diacrylate.

The photosensitive compositions of this invention do not scatter actinic radiation substantially when in the form of thin layers, as described above. In order to secure a substantially transparent mixture, i.e., a non-radiation-scattering mixture, the butadiene copolymer and polymer components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents, and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

Another essential ingredient of the photosensitive compositions of this invention is an organic, radiation-sensitive, free-radical generating initiator or initiator system (c). Practically any organic, radiation-sensitive, free-radical generating initiator system which initiates polymerization of the unsaturated compound and does not excessively terminate the polymerization can be used in the photosensitive compositions of this invention. The term "organic" is used here and in the claims to designate compounds which contain carbon, and one or more of oxygen, hydrogen, nitrogen, sulfur and halogen, but no metal. Because process transparencies used for imagewise exposure transmit heat originating from conventional sources of actinic radiation, and since the photosensitive compositions are usually prepared under conditions resulting in elevated temperatures, the preferred free-radical generating initiator compounds are inactive thermally below 85° C. and more preferably below 185° C. They should be dispersible in the composition to the extent necessary for initiating the desired polymerization or crosslinking under the influence of the amount of radiation absorbed in relatively short term exposures. These initiators are useful in amounts from about 0.001 to about 10% by weight, and preferably from about 0.1 to about 5% by weight based on the total weight of the solvent-free photosensitive composition.

The free-radical generating initiator system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating initiator system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-phenyl-2,2-dimethoxyacetophenone (2,2-dimethoxy-1,2-diphenyl ethanone), 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)-imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863 which is incorporated by reference.

The photosensitive compositions may also contain a small amount of thermal addition polymerization inhibitor, e.g., 0.001% to 2.0% by weight, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, $\beta$-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated by reference. Other useful inhibitors include p-toluquinone, chloranil and thiazine dyes, e.g., Thionine Blue G (CI 52025), Methylene Blue B (CI 52015) and Toluidine Blue (CI 52040). Such photosensitive compositions can be photopolymerized or photocrosslinked without removal of the inhibitor. The preferred inhibitors are 2,6-di-tert-butyl-4-methylphenol and p-methoxyphenol.

The oxygen and ozone resistance of photosensitive compositions of this invention and printing reliefs made therefrom can be improved by incorporating into the photosensitive composition a suitable amount of compatible well known antioxidants and/or antiozonants. Antioxidants useful in this invention include: alkylated phenols, e.g., 2-6-di-tert-butyl-4-methylphenol; alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octylthio)-1,3,5-triazine; polymerized trimethyldihydroquinone; and dilauryl thiopropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylate acid copolymer, polyurethanes, polypentadienes, polybutadiene, furfural-derived resins, ethylene/propylene/diene rubber, diethylene glycol ester of rosin and $\alpha$-methylstyrene/vinyltoluene copolymer. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are substantially transparent at the wavelengths used for exposure of the photosensitive material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive composition preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers. Other useful plasticizers include oleic acid, lauric acid, etc. Polyesters are preferred plasticizers, e.g., polyethylene sebacate, etc. The plasticizer is generally present in an amount of 1 to 15% by weight based on weight of total solids of the photosensitive composition.

The photosensitive compositions of this invention can be prepared in any suitable way by mixing the ingredients, i.e., (a) the high molecular weight butadiene/acrylonitrile copolymer, (b) the compatible ethylenically unsaturated compound, and (c) the free-radical generating initiator system. For example, flowable compositions can be made by mixing them and other desired adjuvants in any order and, if desired, with the aid of a solvent such as chlorinated hydrocarbons, e.g., methylene chloride, chloroform, methyl chloroform, chlorobenzene, trichloroethylene, tetrachloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling, mixing, and solution techniques can be used in making these compositions, the particular technique varying with the differences in properties of the respective components. The homogeneous, substantially nonradiation-scattering compositions, are formed into layers or sheets in any desired manner. For example, solvent-casting, hot pressing, calendering, or extrusion are suitable methods for preparing layers of the desired thickness.

The photosensitive elements of this invention can be made by solvent casting or by extruding, calendering or pressing at an elevated temperature the photosensitive composition into the form of a photosensitive layer or self-supporting sheet on a suitable casting wheel, belt or platen. The layer or sheet may then be laminated to the surface of the flexible support described above and may be adhered by means of an adhesive blend as described below. When a solution is used the coating may be made on an adhesive-bearing support.

The thickness of the photosensitive layer formed is a direct function of the thickness desired in the relief image and this will depend on the subject being reproduced and the ultimate use of the relief, e.g., thick soft reliefs are useful for flexographic printing and thin hard reliefs are useful for planographic printing, In general, the thickness of the photosensitive layer will be less than about 0.250 inch, e.g., it will vary from about 0.005 to about 0.250 inch (0.13 to 0.635 cm) and layers within this range of thickness will be used for the majority of the printing plates.

Between the photosensitive layer and flexible support described above is preferably placed a layer of an adhesive blend which comprises at least two polymers taken from a group of the following four polymers:

(1) Polyester resin, a condensation polymer of ethylene glycol, terephthalic acid, isophthalic acid and azelaic acid in a molar ratio of about 6:2:1:3 have a $\overline{M}n$ of 19,000 and $\overline{M}w$ of 37,000;

(2) Polyether polyurethane resin, a crystalline, thermoplastic resin having a Brookfield viscosity of 100–1200 centipoises using 15% by weight solids in methyl ethyl ketone and a Brookfield spindle #3 at 12 rpm, and an adhesive activation temperature in the range of 54° to 63° C. The polyether polyurethane has an elongation at yield of 15%, elongation at break of 615%, modulus at 400% elongation of 600 psi (42.18 kg/cm$^2$), decrystallization temperature of about 49° C.;

(3) Polyamide resin, a translucent light amber color, Ball and Ring softening point of 132°–145° C., melt viscosity of 40 to 60 poises at 210° C., flash point greater than 299° C., percent water absorption for 1 day is 0.7, for 7 days is 1.6, tensile yield of 460 psi (32.34 kg/cm$^2$), tensile break of 450 psi (31.64 kg/cm$^2$) and elongation of 560%. (The tensile yield, tensile break and elongation are determined at 24° C. according to ASTM Procedure D-1708); and (4) Polyamide resin, a translucent light amber color, Ball and Ring softening point of 150°–160° C.; viscosity of 28–38 poises at 210° C., percent water absorption for 1 day is 1.5, for 7 days is 2.8, and

|  | −18° C. | 24° C. | 60° C. |
|---|---|---|---|
| Tensile yield, psi (kg/cm$^2$) | 980 (68.89) | 400 (28.12) | 70 (4.92) |
| Tensile break, psi (kg/cm$^2$) | 2200 (154.66) | 360 (25.31) | 50 (3.52) |
| elongation (%) | 350 | 250 | 40 |

(The tensile yield, tensile break and elongation are determined at the stated temperatures according to ASTM Procedure D-1708).

The number average molecular weights ($\overline{M}n$) of the resins can be determined by gel permeation chromatography (GPC) employing a known standard, e.g., polybutadiene, as known to those skilled in the art. The weight average molecular weights ($\overline{M}w$) of the resins can be determined by using a light scattering technique using known standard samples, e.g., polystyrene, polymethacrylic acid, polymethylmethacrylate, etc., as known to those skilled in the art.

The particular polymers can be present in the adhesive blend in the following ranges based on the total weight of resin in the adhesive composition: (1) 0 to 78% by weight, (2) 0 to 78% by weight, (3) 0 to 94% by weight, and (4) 0 to 97% by weight. Preferred adhesive blends containing four, three and two resin components are set forth below wherein the percentages are by weight based on the total resin content.

Percentage ranges for the quaternary adhesive blend are:

(1) 25 to 31%, preferably 25%,
(2) 25 to 31%, preferably 25%,
(3) 25 to 19%, preferably 25%, and
(4) 25 to 19%, preferably 25%.

Percentage ranges for two tertiary adhesive blends, A and B, are:

A.

(1) 1 to 78%, preferably 1 to 65%,
(2) 1 to 78%, preferably 1 to 65%, and
(3) 1 to 94%, preferably 1 to 90%; and

B.

(1) 1 to 63%, preferably 1 to 45%,
(3) 1 to 93%, preferably 1 to 85%, and
(4) 1 to 97%, preferably 1 to 90%.

Percentage ranges for five binary adhesive blends, C to G, are:

C.

(1) 7 to 77%, preferably 15 to 50%, most preferably 30% and
(3) 93 to 23%, preferably 85 to 50%, most preferably 70%.

(This adhesive blend is particularly preferred.)

D.

(1) 3 to 60%, more preferably 5 to 30%, and
(4) 97 to 40%, more preferably 95 to 70%,

E.

(1) 23 to 77%, more preferably 35 to 45%, and
(2) 77 to 23%, more preferably 65 to 55%.

F.

(2) 10 to 60%, preferably 25 to 30%, and
(4) 90 to 40%, preferably 75 to 70%; and

G.

(2) 7 to 72%, preferably 15 to 50%, and
(3) 93 to 28%, preferably 85 to 50%.

The adhesive blends of this invention provide an adhesion value for the photosensitive layer to the support of at least 3 lbs/inch (53.57 kg/m) and generally much greater adhesion, e.g., in the range of 8 lbs/inch (142.86 kg/m) or more. These adhesion values are sufficient when the elements of the invention are used as printing plates, particularly flexographic printing plates.

The adhesive blends preferably contain additives such as antiblocking agents, colorants, e.g., dye, etc. Useful antiblocking agents include: preferably polyolefin particles or beads but also other hard particles or beads such as silicon dioxide, etc. Dioctyl sodium sulfosuccinate, a surfactant, can be used. A preferred polyolefin material is described in the examples. The bead size of the antiblocking agents can be greater than the thickness of the adhesive layer resulting in beads partially protruding out of the layer of the adhesive blend. Such a configuration appears to have little of no effect on the degree of adhesion. Many types of colorants or dyes are also useful in the adhesive layer. A preferred dye is Du Pont Milling Blue BL (CI Acid Blue 59). Other useful dyes include: Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), C.I. 109 Red Dye, Rhodamine 3 GO (CI Basic Red 4), Rhodamine 6 GDN (CI Basic Red 1 or CI 45160), Fuchsine dye (CI 42510), Calcocid Green S (CI 44090) and Anthraquinone Blue 2 Ga (CI Acid Blue 58).

An adhesive solution is prepared by adding the ingredients generally in the following order to the solvent with continuous stirring: polymers, polyolefin antiblocking agent, colorants. Useful solvents include mixtures, e.g., methylene chloride/ethyl acetate, methylene chloride/n-butyl acetate, methylene chloride/cyclohexanone, methylene chloride/methanol/Cellosolve®, etc., and preferably a mixture of methylene chloride/Cellosolve®, 90/10 parts. Additional solvent can be added to make up any weight loss. The choice of solvents is governed by the need to provide the fastest practical drying rates without blistering the coating and without leaving behind small amounts of solvent. The solvents should also have a solubilizing effect on the dyes that may be present.

The adhesive solution is then applied to the flexible support by known means, e.g., coated by use of a doctor blade or in a commercially available continuous web coater-drier to provide a dry coating weight in the range of about 80 to 500 mg/dm$^2$ preferably about 260 to 300 mg/dm$^2$. A most preferred coating weight of the adhesive layer is about 260 mg/dm$^2$. Generally, the adhesive layer has a dry thickness of 0.0008 to 0.001 inch (0.020 to 0.025 mm). In a continuous coating the web speed can vary, e.g., 15 to 150 feet/minute (4.57 to 45.72 m/minute). The drying temperature ranges from 60° to 130° C., preferably 80°–90° C.

A preferred flexible support is flame-treated polyethylene terephthalate, 0.001 to 0.007 inch (0.025 to 0.18 mm) thick, preferably 0.005 inch (0.13 mm) in thickness. Flame-treatment of polymeric films is known. The following U.S. patents describe useful procedures and apparatus for flame treating polymeric films: Bryan U.S. Pat. No. 3,145,242, and Thompson U.S. Pat. Nos. 3,360,029 and 3,391,912 which are incorporated by reference. The fuel equivalence ratio of the combustible gas mixture, $\phi$, is 1.4 which is equal to 5 (propane flow rate)/[(oxygen flow rate)+(0.21 air flow rate)]. All flow rates are in standard cubic feet or cubic liters/minute. The web speed is 175 lineal feet/minute (53.34 m/minute).

The dried adhesive coated support can be adhered immediately to the photosensitive layer or can be stored for subsequent adherence. To form a photosensitive element an adhesive-coated support can be laminated to the photosensitive layer in a press, e.g., at 140° to 160° C. at a pressure of 20,000 to 30,000 psi (1406 to 2109 kg/cm$^2$) for up to about three minutes, followed by cooling in the press to less than 60° C. Preferably the photosensitive element is prepared by calendering. The photosensitive layer of the element, which preferably is formed by extruding through a die, has present on the side remote from the side adjacent the adhesive layer a 0.005 inch (0.13 mm) thick polyethylene terephthalate film which subsequently acts as a protective cover sheet. Other films can be used such as polystyrene, polyethylene, polypropylene or other strippable material. There preferably is present between the photosensitive layer and the film cover sheet a thin hard, flexible, solvent-soluble layer, such as a flexible, polymeric film or layer, e.g., a polyamide or a copolymer of ethylene and vinyl acetate. The flexible polymeric film remains on the photosensitive layer after removal of the film cover sheet described above. The flexible polymer film protects for reuse an image-bearing negative or transparency superposed thereon or improves contact or alignment with the photosensitive surface. Prior to the imagewise exposure using the sources described below, the photosensitive element is exposed through the support to polymerize a predetermined thickness of the photosensitive layer adjacent the adhered support. This polymerized portion of the photosensitive layer is designated a floor. The floor thickness varies with the time of exposure, exposure source, etc. The exposure is generally for 1 to 30 minutes.

Printing reliefs can be made in accordance with this invention by exposing to actinic radiation selected portions of a photosensitive layer of an element described above, for example, through a process transparency, i.e., an image-bearing transparency or stencil having areas substantially transparent to actinic radiation and of substantially uniform optical density and areas opaque to actinic radiation and of substantially uniform optical density until substantial addition-polymerization or photocrosslinking takes place. During the addition-polymerization or crosslinking, the butadiene/acrylonitrile copolymer/ethylenically unsaturated compound composition is converted to the insoluble state in the radiation-exposed portions of the layer, with no significant polymerization or crosslinking taking place in the unexposed portions or areas of the layer. The unexposed portions of the layer are removed by means of a liquid developer for the high molecular weight butadiene/acrylonitrile copolymers. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photosensitive layer underneath the clear portions of the transparency. This results in a polymeric relief having its greatest width at the bottom of the photosensitive layer, i.e., a frustum, the top surface of the relief being the dimensions of the clear area.

Inasmuch as the free-radical generating initiator systems activatable by actinic radiation generally exhibit their maximum sensitivity in the ultraviolet range, the radiation source should furnish an effective amount of this radiation, preferably having a wavelength range between about 2500 Å and 5000 Å.

Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc, a sunlamp or high ultraviolet output fluorescent tubes are used at a distance of about 1.5 to about 60 inches (3.8 to 152 cm) from the photosensitive composition. Exposure temperatures are not particularly critical, but it is preferred to operate at about ambient temperatures or slightly higher, i.e., about 20° to about 35° C.

After imagewise exposure, the image may be developed by washing with a suitable developer. The developer liquid should have good solvent or swelling action on the butadiene/acrylonitrile copolymer/ethylenically unsaturated compound composition and little action on the insolubilized image or upon the support or adhesive layer in the period required to remove the nonpolymerized or noncrosslinked portions. The developer should preferably also remove the polymeric film layer, if present. Suitable developers include: organic solvents, e.g., 2-butanone, benzene, toluene, xylene, trichloroethane, trichloroethylene, methyl chloroform, tetrachloroethylene, and solvent mixtures, e.g., tetrachloroethylene/n-butanol, etc. When the high molecular weight butadiene/acrylonitrile copolymer component contains carboxyl groups, suitable developers include: aqueous base to which a water-soluble organic solvent may be added. Suitable specific developer mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, sodium carbonate/2-(2-butoxyethoxy)ethanol/water and sodium hydroxide (0.5 weight percent) in 16.6 volume percent 2-(2-butoxyethoxy) ethanol in water, which is preferred. The particular developer combination chosen will depend upon the carboxyl content of the photosensitive composition and the properties and amounts of the binders employed. Other aqueous developer combinations which may be employed are described in U.S. Pat. No. 3,796,602 which is incorporated by reference. These aqueous base/water-soluble organic solvent combinations may be preferred in some cases because of their low cost, nonflammability and reduced toxicity.

Development may be carried out at about 25° C., but best results are sometimes obtained when the solvent is warm, e.g., 30°–60° C. Development time can range from 1 to 120 minutes, preferably 1 to 25 minutes.

In the development step where the relief is formed, the developer may be applied in any convenient manner, as by pouring, immersion, spraying, or roller application. Brushing aids in the removal of the unpolymerized or uncrosslinked portions of the composition. When the printing plate undergoes aqueous development, a wate rinse is subsequentially applied, e.g., for about 5 to 300 seconds to the developed plate to remove traces of developer from the plate surface. The term "aqueous development" includes the water rinse.

After solvent development, the printing plate is dried at a temperature in the range of room temperature to about 125° C., preferably 60° C. for one hour. After aqueous development the printing plate may be dried, but it has been found that the rinsed aqueous developed plate while still wet can be contacted with the aqueous bromine-containing or iodine-containing solution. The optional hot air drying can be accomplished by use of a forced hot air drier or other suitable dryer.

The plate is first contacted with an aqueous solution having a free bromine concentration of 0.01 to 3.5% by weight and pH of 0.7 to 8.5, for about 15 seconds to 20 minutes or an aqueous solution having a free iodine concentration of 0.2 to 10% by weight for about 1.0 to 10 minutes. Either of these halogen treatments is followed by a chlorine treatment, e.g., a solution having a free chlorine concentration equivalent to that supplied by an aqueous solution 0.01 to 1.0 molar in NaOCl and 0.012 to 1.2 molar in HCl, for about 15 seconds to 5 minutes.

The plate can either be flooded with the aqueous bromine solution or can be dipped in the bromine solution, the latter being preferred. It is preferred to maintain the bromine solution in contact with the printing plate for from 15 seconds to 20 minutes, more preferably from 30 seconds to 5 minutes. The bromine solution is preferably used at ambient temperature but can be heated up to about 35° C. The bromine-containing solution can be prepared by addition to water of (1) bromine, (2) bromate-bromide-acid system wherein the bromate and bromide are salts of alkali metals, preferably sodium or potassium, and the acid may be hydrochloric, hydrobromic, sulfamic, or other strong proton acid, (3) complexes containing bromine such as described in German published application No. 2,823,300, or (4) monopersulfate-bromide system wherein the monopersulfate and the bromide are salts of alkali metals, preferably sodium or potassium as noted above, the system being disclosed in Greutzmacher, Munger and Warfield U.S. application Ser. No. 375,975, filed May 7, 1982 which is incorporated by reference. Preferably the bromine-containing solution can be prepared by addition of 20 ml of conc. HCl to 1800 ml of tap water with mixing. To this solution is added with mixing a mixture of 200 ml tap water, 10 g potassium bromide and 2.8 g potassium bromate (90.56% $H_2O$/8.81% HCl/0.49% KBr and 0.14% $KBrO_3$). The free bromine concentration is 0.4%.

In lieu of the aqueous bromine treatment, the printing plate can either be flooded with the aqueous iodine solution, or can be dipped in the solution, which is preferred. Preferably the iodine solution is maintained in contact with the printing plate for from 1.5 to 2.5 minute. The iodine solution is preferably used at ambient temperature but can be heated up to about 35° C. Preferably the iodine-containing solution can be prepared by addition of potassium iodide, e.g., 6.4 grams, and iodine, e.g., 12.7 grams, to 200 ml water.

After one of the above halogen treatments, the printing plate is either flooded or dipped in an aqueous chlorine solution. Preferably the chlorine solution is maintained in contact with the printing plate for from 0.5 to 1.0 minutes. The chlorine solution is preferably used at ambient temperature but can be heated up to about 35° C. The chlorine-containing solution can be prepared by addition of Clorox®, 90 ml, and concentrated, i.e., 37%, hydrochloric acid, 10 ml, to water, 900 ml.

The printing plate, after imagewise exposure and development, can be postexposed to a source of actinic radiation, either prior to or subsequent to the above-described halogen treatments. The postexposure is generally for 5 to 15 minutes duration preferably to the actinic radiation source used for the imagewise exposure. After both treatments the printing plate is ready for use. A preferred mode is illustrated in Example 1.

INDUSTRIAL APPLICABILITY

Printing reliefs prepared from the photosensitive flexographic elements of the invention can be used in all classes of printing but are most applicable to those classes of printing wherein a distinct difference of height between printing and nonprinting areas is required and particularly to the flexographic printing class wherein a resilient print area is required, e.g., for printing on deformable printing surfaces. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in intaglio printing, e.g., line and inverted halftone. The plates are particularly useful for multicolor printing.

The relief and printed images obtained show fidelity to the original transparency both in small detail and in overall dimensions even when the element is imagewise exposed on a cylindrical support. The reliefs have high impact strength, are tough and abrasion-resistant, have broad ink compatibility, and have improved solvent resistance.

EXAMPLES

The following examples illustrate the invention wherein parts and percentages are by weight. The following tests are useful in evaluating a printing plate.

TACK TEST

An exposed, developed printing plate of this invention can be tested for tackiness as follows:

(1) The surface is wiped clean with isopropanol,
(2) Tissue such as Scott ® brand 510 toilet tissue is pressed by means of a 500 g weight against the plate surface (1 inch by 2 inches; 2.54 cm by 5.08 cm) for 30 seconds,
(3) The tissue is removed noting the results:
  (A) No tack—free from sticking
  (B) Slight tack—sticks but peels from surface
  (C) Tacky—peels but leaves a few fibers on the plate
  (D) Very tacky—sticks and tissue rips upon peeling.

Skilled artisans learn to identify nontacky or (A) grade printing plate surfaces by touch, i.e., finger-tip touch methods. Both methods have been used. All treated samples below are tack free.

INK/SOLVENT COMPATIBILITY TEST

The following procedure is used to determine the compatibility and usefulness of printing inks and solvent with flexographic printing plates having a layer of the photosensitive, elastomeric composition described herein. A flat exposed, developed printing plate, after determination of its thickness, Shore ®A hardness (ANSI/ASTM D2240-75) and weight, is immersed for 24 hours in a particular solvent or ink. Upon removal from the solvent or ink, and patting dry with a cotton swab, the thickness, Shore ®A hardness and weight are determined. If the raw data expressing changes in thickness ($\Delta T$) expressed in inches (millimeters), Shore ®A hardness ($\Delta H$), and weight ($\Delta \% W$) meet all of the following standards, the printing plate is deemed to be compatible or excellent (E) with respect to the solvent and/or ink:

$\Delta T_{raw}$: $\leq 0.003$ inch (0.076 mm)
$\Delta H_{raw}$: $\geq -5$ Shore ®A units
$\Delta \% W_{raw}$: $\leq 3.5\%$.

When any of the following standards are met or exceeded the printing plate is deemed to be incompatible or unsatisfactory (U) with respect to the solvent and/or ink:

$\Delta T_{raw}$: $\geq 0.012$ inch (0.305 mm)
$\Delta H_{raw}$: $\leq -20$ Shore ®A units
$\Delta \% W_{raw}$: $\geq 7.0\%$ In the intermediate range between the above two standards the treated printing plates are of variable intermediate (I) utility with respect to the solvent and/or ink.

In addition to the above descriptive ratings useful with single halogen treatments, it is also desirable to combine the results of the three physical measurements into a single Figure of Merit, hereinafter designated F. F-values for separate individual treatments can then be added together to provide a heuristic prediction of an expected F for the combination of treatments.

F is obtained using the following formula:

$$F = \frac{23.60 - (0.152 \, \Delta T_{raw} - 0.231 \, \Delta H_{raw} + 0.4 \, \Delta \% W_{raw})}{23.60}$$

The numerical coefficients for the various raw data are obtained from normalizing factors derived from performance of a control plate as described below, given no halogen treatment and tested in 80-isopropanol/20-ethyl acetate by volume, and from weighting factors estimated by skilled artisans to indicate the relative importance of the data in predicting printing performance.

The weighting factors (wf) are:
  0.35 for $\Delta T$
  0.25 for $\Delta H$
  0.40 for $\Delta \% W$ The normalizing factors (nf) are obtained from the control plate raw data as follows:

| Raw Data | (nf) |
| --- | --- |
| $\Delta T_{raw} = 54.5$ | $\frac{23.6}{54.5} = 0.433$ |
| $\Delta H_{raw} = -25.5$ | $\frac{23.6}{-25.5} = -0.925$ |
| $\Delta \% W_{raw} = 23.60$ | $\frac{23.6}{23.6} = 1.000$ |

The numerical coefficients, i.e., the products $(wf)_i \times (nf)_i$ are then:
  0.152 for $\Delta T_{raw}$
  $-0.231$ for $\Delta H_{raw}$
  0.400 for $\Delta \% W_{raw}$ In order to normalize all data to the same scale, i.e., 0–1, the coefficient for $\Delta H_{raw}$ must be negative since $\Delta H_{raw}$ is negative.

The choice of 23.60, the $\Delta \% W_{raw}$ for the constant in the expression for F reflects the conclusion that the Δ%W measurement is weighted most heavily of the three.

An F value of 1.0 for a flexographic photopolymerizable printing plate represents an upper value, substantially perfect, for an excellent plate, i.e., solvent soaking causes no change in any of the three measured characteristics. Employing the above formula to determine F, the qualitative standards described above become:

Excellent (E) ≧ = 0.88 to 1.0
Intermediate (I) > = 0.62 to 0.88
Unsatisfactory (U) ≧ = 0.0 to 0.62

When either (1) the printing plate is more sensitive to attack by the chosen solvent, or (2) a stronger solvent has been used in the compatibility test, F can assume a negative values, i.e., less than 0.0. In addition, (3) certain individual treatments or noninventive treatment combinations actually decrease solvent resistance of the treated plate below that of the untreated plate. For example, in Table 2 below see treatments i and j versus treatment g for solvents 2, 3 and 4; and in Table 8 compare the F values for samples 2 and 3, 8 and 9 and 14 and 15. For instances (1) and (2), described above, predicted $F_{combination} = F_1 + F_2$. For instance (3), also described above, predicted $F_{combination} = F_1 + (F_2 - F_{no\ treatment})$. These formulae are used below. The predicted values are independent of treatment order.

In addition to simplifying cross-comparison of the results of various treatment combinations on the subject flexographic printing plates exposed to various ink/solvent combinations, the F value is useful in predicting the number of good impressions to be obtained on printing using a printing plate with a particular F value. The following correlations exist where both press run data and F values are available:

| F | No. of Good Impressions |
|---|---|
| 0.94 | 2,000,000 |
| 0.88 | 200,000 |
| 0.69 | ≦5,000 |

An adhesive solution is prepared from the following ingredients:

| Ingredient | Amount (parts) |
|---|---|
| Polyamide resin (3), Lot No. 0F5237[1] | 63.1 |
| Polyester resin (1),[2] | 27.0 |
| Polyolefin[3] | 9.8 |
| Du Pont Milling Blue BL dye, C.I. Acid Blue 59 | 0.1 |

[1]The polyamide resin, Macromelt ® 6238, a product of Henkel Adhesives Company, a division of Henkel Corp., 4620 West 77th Street, Minneapolis MN is a translucent light amber color, has a Ball and Ring Softening Point of 132–145° C.; melt viscosity of 40 to 60 poises at 210° C.; flash point greater than 299° C.; percent water absorption, 1 day is 0.7, 7 days is 1.6; tensile yield of 460 psi (32.34 kg/cm$^2$); tensile break of 450 psi (31.64 kg/cm$^2$) and elongation of 560%. (The tensile yield, tensile break and elongation are determined at 24° C. according to ASTM Procedure D-1708).
[2]The polyester resin is the reaction product of ethylene glycol, terephthalic acid, isophthalic acid and azelaic acid (molar ratio 6:2:1:3) having a Mn of 19,000 and Mw of 37,000.
[3]The polyolefin, Vestofine ® SF-616, a product of Dura Commodities Corp., 111 Calvert Street, Harrison, New York, is snow white in color, has a molecular weight of about 1,600, a density at 20° C. of about 0.96, penetration hardness at 25° C. of 0.5 to 1.0, a melting point of about 118–128° C., particle size: about 85% 10 microns or below, about 15% 10–20 microns.

The above ingredients are added in order to a 90/10 parts mixture of methylene chloride/Cellosolve ® to give a solution of about 16% solids. The polyolefin beads do not dissolve. The mixture is stirred continuously during and after the addition of the ingredients to effect solution. Any weight loss during mixing is made up by addition of methylene chloride.

The adhesive solution is applied to the flame-treated surface of a polyethylene terephthalate film support, 0.005 inch (~0.13 mm) in thickness using a continuous web coater-drier to provide a dry coating weight of about 260 mg/dm$^2$. The web speed is 45 feet/minute (~13.72 m/minute) and the drying temperature is 86° C. (186.7).

The adhesive-coated polyethylene terephthalate support is placed adhesive side up in a steel platen dammed to a thickness of 0.080 inch (2.03 mm), the thickness of the finished printing plate. The adhesive-coated support and platen are placed on a press and an extruded sheet, 0.090 inch (about 2.29 mm) thick, of a photopolymerizable composition on a 0.005 inch (0.13 mm) thick polyethylene terephthalate cover sheet bearing a layer of a polyamide resin having a dry thickness of 0.00017 inch (0.004 mm) is placed thereon with the cover sheet side up, and is covered with a steel plate.

The cover sheet bearing the polyamide layer is prepared by coating the polyethylene terephthalate film with the following solution using an extrusion die coater:

| Ingredient | Amount (%) |
|---|---|
| Methylene chloride | 81.0 |
| Methanol | 2.0 |
| N—methyl pyrrolidone | 10.0 |
| Polyamide resin[1] | 7.0 |

[1]The polyamide resin, Macromelt ® 6900, a product of Henkel Adhesives Company, a division of Henkel Corp., 4620 West 77th Street, Minneapolis MN is essentially colorless, has a Ball and Ring Softening Point of 266–302° F.; melt index at 347° F. of 5–15 g/10 minutes; flash point 570° F.; percent water absorption, 1 day is 0.2, 7 days is 0.5; tensile yield of 1,200 psi; tensile break of 3,500 elongation and elDongation of 540%. (The tensile yield, tensile break and elongation are determined at 24° C. according to ASTM Procedure D-1708).

The extruded sheet of the photopolymerizable composition is prepared from the following ingredients which are blended and the blend is extruded at 170° C. through a die.

| Ingredient | Amount (parts) |
|---|---|
| Acrylonitrile (27)/butadiene (70)/acrylic acid (3), high molecular weight, (average Mooney Viscosity is 45.0, Hycar ® 1472 × 26 B.F. Goodrich Chemical Co. | 81.59 |
| Hexamethylene diacrylate | 10.0 |
| Polyethylenesebacate[4] | 5.0 |
| Dibutyltin-S,S—-bis-isooctyl-mercapto-acetate | 2.0 |
| 2-Phenyl-2,2-dimethoxyacetophenone | 1.25 |
| 2,6-Di-t-butyl-4-methylphenol | 0.10 |
| 1,4,4-Trimethyl-2,3-diazabicyclo-(3.2.2)-non-2-ene-2,3-dioxide | 0.05 |
| Du Pont Milling Blue BL dye, C.I. Acid Blue 59 (10% dispersion in ethylene glycol) | 0.01(dry) |

[4]Paraplex ® G-30, a low molecular weight polyester resin manufactured by Rohm and Haas, Philadelphia, PA.

The temperature is raised and pressure is gradually applied which spreads the photopolymerizable sheet throughout the dammed area of the platen. After the sheet is evenly distributed the temperature is raised to 160° C. and pressure in the range of 20,000 to 30,000 psi (1406 to 2109 kg/cm$^2$) is applied and held for three minutes. The assembly is cooled in the press to less than 60° C. by flowing water through the press platens. The laminated element formed is removed from the press and is placed support side up in the exposure unit noted below. The element is given an overall exposure in air at atmospheric pressure for 4 minutes through the support to polymerize a predetermined thickness of the photopolymerizable layer adjacent the adhered support. This polymerized portion of the element is designated a floor.

After removal of the cover sheet, the element is then placed in a Cyrel®3040 Exposure Unit (registered trademark of E. I. du Pont de Nemours and Company) fitted with Sylvania BL-VHO fluorescent lamps. An image-bearing transparency (negative), and the element is exposed for 15 minutes while under vacuum. The duration of exposure is a function of the photopolymer sheet thickness, thickness of the polymerized floor and the type of image-bearing transparency used.

After exposure the transparency is removed, and the exposed element is placed in a rotary drum-brush type Cyrel®3040 Processor. The unpolymerized areas of the element and the entire polyamide resin layer are removed in the processor by washing for 15 minutes with 0.5 weight percent sodium hydroxide in 16.6 volume percent 2-(2-butoxyethoxy)ethanol in water followed by a two minute water rinse or with an 80/20 tetrachloroethylene/butanol mixture. A 0.035 inch (0.89 mm) relief image is obtained. The developed element (printing plate) is placed in a forced hot air drier or other suitable drier and is dried at 60° C. for 15 minutes.

In the Examples below the following halogen treatment solutions are used:

Bromine: 20 ml of conc. HCl is added with mixing to 1800 ml tap water. To this solution with mixing is added a mixture of 200 ml tap water, 10 g potassium bromide and 2.8 g potassium bromate (free bromine concentration is 0.4%).

Iodine: 6.4 g potassium iodide and 12.7 g iodine to 200 ml water.

Chlorine: 90 ml Clorox® and 10 ml conc. (37%) HCl to 900 ml water (~0.06 molar in NaOCl and ~0.12 molar in HCl).

EXAMPLE 1

Exposed, developed flexographic printing plates as described above are postexposed in air for 10 minutes using the same exposure source used for the imagewise exposure. The plates have a Shore®A2 hardness in the range of 56 to 60. The plates are halogen treated as described below (one control is not halogen treated) and then soaked for 24 hours in various solvent mixtures and in 100% 2-propanol. The strength of the solvent increases as more ethyl acetate is added to the 2-propanol. The plates are tested for solvent resistance as described in the Ink/Solvent Compatibility Test. The raw data values obtained are set forth in Table 1 below. The F values calculated are set forth in Table 2 below. The codes in the tables are:

1 is 2-propanol
2 is 2-propanol (95)/ethyl acetate (5)
3 is 2-propanol (90)/ethyl acetate (10)
4 is 2-propanol (85)/ethyl acetate (15)
5 is 2-propanol (80)/ethyl acetate (20)

a $Br_2$ 10 min; $Cl_2$ 0.5 min
b $Br_2$ 2 min; $Cl_2$ 0.5 min
c $Br_2$ 10 min; $Cl_2$ 0.5 min (calc)*
d $Br_2$ 2 min; $Cl_2$ 0.5 min (calc)*
e $Br_2$ 10 min; $Cl_2$ none
f $Br_2$ 2 min; $Cl_2$ none
g $Br_2$ none; $Cl_2$ none
h $Cl_2$ 0.5 min; $Br_2$ 10 min
i $Cl_2$ 0.5 min; $Br_2$ 2 min
j $Cl_2$ 0.5 min; $Br_2$ none

*F-values in Table 2 for the indicated single treatments are summed arithmetically to give predicted values of F for these treatments.

TABLE 1

| Solvent | Treatment | $\Delta T_{raw}$ | $\Delta H_{raw}$ | $\Delta \% W_{raw}$ |
|---|---|---|---|---|
| 1 | a | 0 | 0 | 0.30 |
| 1 | b | 0 | 0 | 0.34 |
| 1 | e | 0.2 | −0.90 | 1.00 |
| 1 | f | 0.3 | −1.25 | 1.72 |
| 1 | g | 7.0 | −11.5 | 5.51 |
| 1 | h | 0.1 | −1.0 | 0.62 |
| 1 | i | 10.4 | −10.0 | 4.64 |
| 1 | j | 7.6 | −11.0 | 5.54 |
| 2 | a | 0.1 | −0.5 | 0.71 |
| 2 | b | 0.2 | −1.0 | 0.96 |
| 2 | e* | — | — | — |
| 2 | f* | — | — | — |
| 2 | g* | — | — | — |
| 2 | h | 0.9 | −3.0 | 1.78 |
| 2 | i | 29.0 | −16.0 | 9.35 |
| 2 | j* | — | — | — |

*F-values in Table 2 are obtained by curvilinear interpolation between solvent 1 and solvent 3 values

| Solvent | Treatment | $\Delta T_{raw}$ | $\Delta H_{raw}$ | $\Delta \% W_{raw}$ |
|---|---|---|---|---|
| 3 | a | 0.1 | −1.0 | 1.37 |
| 3 | b | 0.3 | −2.0 | 1.51 |
| 3 | e | 0.8 | −2.0 | 3.05 |
| 3 | f | 1.99 | −2.25 | 5.76 |
| 3 | g | 23.2 | −21.25 | 12.14 |
| 3 | h | 1.5 | −5.0 | 3.09 |
| 3 | i | 39.5 | −17.0 | 14.79 |
| 3 | j | 35.5 | −21.75 | 12.71 |
| 4 | a | 0.3 | −2.0 | 2.29 |
| 4 | b | 1.0 | −3.25 | 2.75 |
| 4 | e* | — | — | — |
| 4 | f* | — | — | — |
| 4 | g* | — | — | — |
| 4 | h | 30.6 | −18.0 | 10.31 |
| 4 | i | 44.9 | −22.0 | 20.75 |
| 4 | j* | — | — | — |
| 5 | a | 1.4 | −4.0 | 4.05 |
| 5 | b | 1.2 | −4.0 | 4.91 |
| 5 | e | 3.5 | −7.0 | 10.05 |
| 5 | f | 8.0 | −16.75 | 12.38 |
| 5 | g | 54.5 | −25.5 | 23.60 |
| 5 | h | 52.2 | −22.0 | 17.20 |
| 5 | i | 54.5 | −28.0 | 26.60 |
| 5 | j | 61.0 | −23.0 | 22.91 |

*F-values in Table 2 are obtained by curvilinear interpolation between solvent 3 and solvent 5 values

TABLE 2

| | F-values for Indicated Solvent and Treatment* | | | | |
|---|---|---|---|---|---|
| Treatment | 1 | 2 | 3 | 4 | 5 |
| a | 0.99 | 0.98 | 0.97 | 0.95 | 0.85 |
| b | 0.99 | 0.98 | 0.95 | 0.92 | 0.80 |
| c** | 1.01 | 0.90 | 0.82 | 0.77 | 0.75 |
| d*** | 0.99 | 0.89 | 0.79 | 0.70 | 0.53 |
| e | 0.98 | 0.96 | 0.91 | 0.85 | 0.74 |
| f | 0.96 | 0.95 | 0.88 | 0.78 | 0.52 |
| g | 0.74 | 0.60 | 0.43 | 0.23 | 0.0 |
| h | 0.99 | 0.96 | 0.88 | 0.45 | 0.12 |
| i | 0.76 | 0.50 | 0.33 | 0.14 | 0.0 |
| j | 0.77 | 0.54 | 0.34 | 0.15 | 0.01 |

*calculated from raw data values of Table 1
**$F_c = F_e + (F_j - F_g)$
***$F_d = F_f + (F_j - F_g)$ As noted from the values in Table 2, printing plates treated according to the invention, a and b, are superior in solvent resistance to similar printing plates treated by noninventive treatments, e to j, particularly as the solvent gets stronger, 1 to 5. The plates are also superior to calculated treatments, c and d. In 2-propanol, a very weak solvent, the F values calculated are basically the same for two halogen treatments in either order.

Table 3, which follows, is constructed from the data of Table 2, values for a, b, c, d, h, and i in solvents 1 to 5, to show the difference in F values between the halogen treatments of the invention and reverse order treatments.

TABLE 3

F-Values for Indicated Solvent and Treatment*

| Treatment or Difference | 1 | 2 | 3 | 4 | 5 |
|---|---|---|---|---|---|
| a | 0.99 | 0.98 | 0.97 | 0.95 | 0.85 |
| c** | 1.01 | 0.90 | 0.82 | 0.77 | 0.75 |
| h | 0.99 | 0.96 | 0.88 | 0.45 | 0.12 |
| a−c = Δ invention (observed-calculated) | −0.2 | 0.08 | 0.15 | 0.18 | 0.10 |
| h−c = Δ reverse order (observed-calculated) | −0.02 | 0.06 | 0.06 | −0.32 | −0.63 |
| b | 0.99 | 0.98 | 0.95 | 0.92 | 0.80 |
| d*** | 0.99 | 0.89 | 0.79 | 0.70 | 0.53 |
| i | 0.76 | 0.50 | 0.33 | 0.14 | 0 |
| b−d = Δ invention (observed-calculated) | 0 | 0.09 | 0.16 | 0.22 | 0.27 |
| i−d = Δ reverse order (observed-calculated) | −0.23 | −0.39 | −0.46 | −0.56 | −0.53 |

*calculated from raw data values of Table 1
**$F_c = F_e + (F_f - F_g)$
***$F_d = F_f + (F_j - F_g)$ The positive values observed in Table 3 for the differences a−c and b−d show synergism (superadditivity) for treatments of the invention. The generally negative values observed in Table 3 for the differences h−c and i−d show the poor results obtained when the chlorine treatment precedes treatment with bromine.

EXAMPLE 2

Exposed, developed postexposed flexographic printing plates as described in Example 1 and halogen treated as described below are placed in a solution of n-propanol/n-propylacetate (80/20), a stronger solvent than solvent 5 of Example 1. The plate is tested for solvent resistance as described in the Ink/Solvent Compatibility Test. The raw data values of ΔT, ΔH and Δ%W obtained are used to calculate the F values which are set forth in Table 4. The treatment codes are the same as those set forth in Example 1.

TABLE 4

| Treatment | ΔT | ΔH | Δ%W | F |
|---|---|---|---|---|
| Single Treatment | | | | |
| j | 71.6 | −26.0 | 24.24 | −0.13 |
| f | 8.0 | −14.0 | 13.42 | 0.58 |
| e | 4.3 | −7.0 | 8.99 | 0.75 |
| Invention Treatment | | | | |
| b | 3.1 | −5.0 | 6.79 | 0.82 |
| a | 2.1 | −4.0 | 5.27 | 0.86 |
| Control (Reverse Order) | | | | |
| i | 82.4 | −26.0 | 25.75 | −0.22 |
| h | 72.1 | −22.0 | 22.23 | −0.06 |
| Predicted Results | | | | |
| d $F_f + F_j$ | — | — | — | 0.45 |
| c $F_e + F_j$ | — | — | — | 0.62 |
| DIFFERENCES | | | | |
| $F_a - F_c = 0.24$ | Superiority of Invention Over Predicted Result | | | |
| $F_b - F_d = 0.37$ | Superiority of Invention Over | | | |

TABLE 4-continued

| Treatment | ΔT | ΔH | Δ%W | F |
|---|---|---|---|---|
| | Predicted Result | | | |
| $F_a - F_h = 0.92$ | Superiority of Invention Over Control (Reverse Order) | | | |
| $F_b - F_i = 1.04$ | Superiority of Invention Over Control (Reverse Order) | | | |

From the above data, the treatment of the invention is superior to the result predicted from the sum of the individual treatment results and far superior to the reverse order treatments.

EXAMPLE 3

A post-exposed flexographic printing plate, as described in Example 1, is bromine treated for 4.5 minutes followed by chlorine treatment for 30 seconds, rinsed with water and dried. The plate is mounted using double-backed adhesive tape on the printing cylinder of a Gallus-Stanford, Model A 160 printing press manufactured by Ferd, Ruech Machinenfabrik Printers and Engineers, St. Gallen, Switzerland.

Employing a polyethylene substrate and an ink based on the 80/20 n-propanol/n-propylacetate solvent system (Clark Graphics Co., Cyan Blue, #SPX-10833, Batch-5279) a twelve hour press run at 300 impressions per minute yields good quality prints throughout the run for a total of about 200,000 good impressions. A control printing plate treated solely in bromine for 10 minutes yields unsatisfactory quality images after no more than about 10,000 impressions, or in from 15 to 30 minutes press time.

EXAMPLE 4

Additional printing plates as described in Example 1 are prepared, treated and tested as described in the Ink/Solvent Compatibility Test. As noted in Table 5 below, the postexposure step described in Example 1 is performed prior to, between or after the two halogen treatments. The solvent is 3 of Example 1, 2-propanol/ethyl acetate (90/10). The treatment codes a to j are the same as those set forth in Example 1. PE is postexposure. The additional codes k to u are:

k $Br_2$ 0.25 min; $Cl_2$ 0.25 min
l $Br_2$ 0.50 min; $Cl_2$ 0.50 min
m $Br_2$ 0.50 min; PE; $Cl_2$ 0.50 min
n $Br_2$ 0.50 min; $Cl_2$ none
o $Br_2$ 0.25 min; PE; $Cl_2$ 0.25 min
p $Br_2$ 0.25 min; $Cl_2$ none
q $Cl_2$ 0.25 min; $Br_2$ none
r $Br_2$ 10.0 min; PE; $Cl_2$ 0.50 min
s $Br_2$ 10.0 min; $Cl_2$ 0.50 min; PE
t $Br_2$ 2.0 min; PE; $Cl_2$ 0.50 min
u $Br_2$ 2.0 min; $Cl_2$ 0.50 min; PE

TABLE 5

| Sample | Treatment | F Value | Comments |
|---|---|---|---|
| 1 | PE; a | 0.97 | synergistic: 1−8 = 0.13 |
| 2 | PE; b | 0.95 | synergistic: 2−11 = 0.12 |
| 3 | PE; f | 0.93 | |
| 4 | PE; e | 0.91 | |
| 5 | PE; h | 0.90 | |
| 6 | PE; k | 0.85 | |
| 7 | PE; l | 0.84 | |
| 8 | c | 0.84 | |
| 9 | m | 0.83 | |
| 10 | l; PE | 0.83 | |
| 11 | d | 0.83 | |

TABLE 5-continued

| Sample | Treatment | F Value | Comments |
|---|---|---|---|
| 12 | PE; n | 0.81 | |
| 13 | o | 0.80 | |
| 14 | k; PE | 0.76 | |
| 15 | l* | 0.72 | |
| 16 | PE; p | 0.55 | |
| 17 | k* | 0.51 | |
| 18 | g | 0.43 | control, no treatment |
| 19 | PE; q | 0.39 | |
| 20 | PE; j | 0.34 | |
| 21 | PE; i | 0.33 | |

*calculated value

Samples 6, 13 and 14 show variation in F values as the PE sequence is varied for 15 seconds bromine and chlorine treatments. As shown in Table 6, the postexposure is more effective when done initially but is effective in either sequence.

TABLE 6

| Treatment | F Value | Comments |
|---|---|---|
| PE; k | 0.85 | Δ invention is 0.34 (observed-calculated*) |
| o | 0.80 | Δ invention is 0.29 (observed-calculated*) |
| k; PE | 0.76 | Δ invention is 0.25 (observed-calculated*) |

*calculated F is 0.51 for treatment k (Sample 17) in Table 5.

Samples 7, 9 and 10 show variation in F values as the PE sequence is varied for 30 seconds bromine and chlorine treatments. As shown in Table 7, there is little effect in varying the PE sequence.

TABLE 7

| Treatment | F Value | Comments |
|---|---|---|
| PE; l | 0.84 | Δ invention is 0.12 (observed-calculated*) |
| m | 0.83 | Δ invention is 0.11 (observed-calculated*) |
| l; PE | 0.83 | Δ invention is 0.11 (observed-calculated*) |

*calculated F is 0.72 for treatment l (Sample 15) in Table 5.

EXAMPLE 5

Printing plates as prepared in Example 1 are halogen treated as described below (iodine replaces bromine) except for one control which is not halogen treated. After soaking for 24 hours in a solvent mixture of 2-propanol/ethyl acetate (90/10) and patting dry, the printing plates are tested for solvent resistance as described in the above-described Ink/Solvent Compatibility Test. The F Value for each treatment is shown in Table 8.

TABLE 8

| Sample | Treatment (seconds) | F Value | Comments |
|---|---|---|---|
| 1 | $I_2$ (80) | 0.43 | |
| 2 | $Cl_2$ (30) | 0.34 | Poorer than no treatment, 2-3 = (−0.09) |
| 3 | None | 0.43 | |
| 4 | $I_2$ (80); $Cl_2$ (30) | 0.60 | invention |
| 5 | — | 0.34 | calculated from 1 + (2-3) |
| 6 | 4-5 = | — | 0.26, shows synergism Δ (observed-calculated) |
| 7 | $I_2$ (105) | 0.45 | |
| 8 | $Cl_2$ (30) | 0.34 | as 2 above |
| 9 | None | 0.43 | as 3 above |
| 10 | $I_2$ (105); $Cl_2$ (30) | 0.78 | invention |

TABLE 8-continued

| Sample | Treatment (seconds) | F Value | Comments |
|---|---|---|---|
| 11 | — | 0.36 | calculated from 7 + (8-9) |
| 12 | 10-11 = | — | 0.42, shows synergism Δ (observed-calculated) |
| 13 | $I_2$ (138) | 0.61 | |
| 14 | $Cl_2$ (30) | 0.34 | as 2 above |
| 15 | None | 0.43 | as 3 above |
| 16 | $I_2$ (138); $Cl_2$ (30) | 0.79 | invention |
| 17 | — | 0.52 | calculated from 13 + (14-15) |
| 18 | 16-17 = | — | 0.27, shows synergism Δ (observed-calculated) |

From the results of Table 8 it is shown that there is improvement in solvent resistance of the plates when treated according to the invention as compared to the additive results of single treatments. The results of difference between treatments 4-5, 10-11 and 16-17 show that the iodine followed by chlorine treatments gives a synergistic improvement.

EXAMPLE 6

Printing plates prepared as described in Example 1 and halogen-treated according to treatments a, b, r, s, t and u described in Examples 1 and 4 are soaked for 24 hours in 80/20 n-propanol/n-propylacetate and evaluated as described above. The results set forth in Table 9 below, show that post exposure following the two-step halogen treatment is significantly superior to post exposure at other times in the treatment process for printing plates soaked in the above-described aggressive solvent. The results of this example differ from those obtained in Example 4 with the less aggressive solvent, 90/10 2-propanol/ethyl acetate and milder halogen treatments.

TABLE 9

| Treatment | Δ T | Δ H | Δ % W | F |
|---|---|---|---|---|
| a[1] | 2.57 | −8.33 | 6.31 | 0.79 |
| r[2] | 9.00 | −12.0 | 9.45 | 0.66 |
| s[3] | 0.80 | −4.00 | 4.60 | 0.88 |
| b[1] | 19.20 | −14.50 | 11.33 | 0.54 |
| t[2] | 48.60 | −22.00 | 21.06 | 0.12 |
| u[3] | 2.40 | −8.50 | 7.50 | −0.77 |

[1]Pre-post exposure
[2]Intermediate-post exposure
[3]Post-post exposure

We claim:
1. A process for providing an improved solvent resistant surface to a relief photosensitive flexographic printing plate wherein the areas in relief are prepared by imagewise exposure with actinic radiation and liquid development of unexposed areas of a layer of a photosensitive, elastomeric composition comprising a high molecular weight butadiene/acrylonitrile copolymer having a number average molecular weight of 20,000 to 75,000, an acrylonitrile content of 10 to 50% by weight and a carboxyl content of 0 to 15% by weight and a nongaseous ethylenically unsaturated compound containing at least one terminal ethylenic group, the process comprising, in either order,
   (1) postexposing the developed surface to a source of actinic radiation, and
   (2) contacting the developed surface in succession with two aqueous halogen solutions, the first halogen solution being either an aqueous solution having a free bromine concentration of 0.01 to 3.5% by weight, with contact for about 15 seconds to 20 minutes, or an aqueous solution having a free iodine concentration of 0.2 to 10% by weight, with contact for about 1.0 to 10 minutes, followed by the second halogen solution of chlorine equivalent to that supplied by an aqueous solution, 0.01 to 1.0 molar in NaOCl and 0.012 to 1.2 molar in HCl, with contact for about 15 seconds to 5 minutes.

2. A process according to claim 1 wherein the printing plate is contacted first by an aqueous bromine solution followed by an aqueous chlorine solution.

3. A process according to claim 1 wherein the printing plate is contacted first by an aqueous iodine solution followed by an aqueous chlorine solution.

4. A process according to claim 1 wherein the aqueous bromine solution is prepared by mixing bromine or alkali bromate-bromide-acid mixture in water.

5. A process according to claim 1 wherein the flexographic printing plate is prepared by imagewise exposure and liquid development of a photosensitive, elastomeric element which, in order from bottom to top comprises (A) a flexible support;
(B) a layer of a photosensitive, elastomeric composition which comprises, based on the total weight of composition
  (a) 55 to 90% by weight of a high molecular weight butadiene/acrylonitrile copolymer having a number average molecular weight of 20,000 to 75,000, an acrylonitrile content of 10 to 50% by weight and a carboxyl content of 0 to 15% by weight,
  (b) 2 to 40% by weight of a nongaseous, ethylenically unsaturated compound containing at least one terminal ethylenic group, said compound being capable of forming a high polymer by free-radical initiated, chain-propagating addition polymerization and being compatible with polymer (a);
  (c) 0.001 to 10% by weight of an organic, radiation-sensitive, free-radical generating system, activatable by actinic radiation which initiates polymerization of the unsaturated compound; and
  (d) 0 to 15% by weight of a compatible plasticizer;
(c) a flexible, polymeric film;
(D) a removable cover sheet; and
and optionally between layers (A) and (B) a layer of an adhesive composition.

6. A process according to claim 1 wherein the developed surface is prepared by aqueous development and the halogen treatments are applied without drying the developed surface.

7. A relief flexographic printing plate prepared according to the process of claim 1.

8. A relief flexographic printing plate prepared according to the process of claim 5.

9. A process according to claim 1 wherein after liquid development the areas in relief are dried.

* * * * *